(12) United States Patent
Wang et al.

(10) Patent No.: US 10,805,045 B2
(45) Date of Patent: Oct. 13, 2020

(54) POLAR CODE ENCODING METHOD AND DEVICE AND POLAR CODE DECODING METHOD AND DEVICE

(71) Applicant: CHINA ACADEMY OF TELECOMMUNICATIONS TECHNOLOGY, Beijing (CN)

(72) Inventors: Jiaqing Wang, Beijing (CN); Shaohui Sun, Beijing (CN); Xueming Pan, Beijing (CN)

(73) Assignee: CHINA ACADEMY OF TELECOMMUNICATIONS TECHNOLOGY, Beijing (CN)

( * ) Notice: Subject to any disclaimer, the term of this patent is extended or adjusted under 35 U.S.C. 154(b) by 0 days.

(21) Appl. No.: 16/490,559

(22) PCT Filed: Feb. 12, 2018

(86) PCT No.: PCT/CN2018/076533
§ 371 (c)(1),
(2) Date: Sep. 1, 2019

(87) PCT Pub. No.: WO2018/157739
PCT Pub. Date: Sep. 7, 2018

(65) Prior Publication Data
US 2020/0076534 A1  Mar. 5, 2020

(30) Foreign Application Priority Data
Mar. 1, 2017  (CN) .......................... 2017 1 0116484

(51) Int. Cl.
*H04L 1/00*  (2006.01)
*H03M 13/09*  (2006.01)
(Continued)

(52) U.S. Cl.
CPC .......... *H04L 1/0056* (2013.01); *H03M 13/09* (2013.01); *H03M 13/13* (2013.01); *H03M 13/45* (2013.01)

(58) Field of Classification Search
CPC .... H03M 13/13; H03M 13/09; H03M 13/091; H03M 13/00; H03M 13/3769;
(Continued)

(56) References Cited

U.S. PATENT DOCUMENTS

| 9,819,361 B2 | 11/2017 | Shin et al. | |
| 2004/0123221 A1* | 6/2004 | Huffman | H03M 13/093 714/776 |

(Continued)

FOREIGN PATENT DOCUMENTS

| CA | 2971769 A1 | 6/2016 |
| CN | 102694625 A | 9/2012 |

(Continued)

OTHER PUBLICATIONS

Huawei, HiSilicon; "Performance of polar codes for control channel"; 3GPP TSG RAN WG1 Ad-Hoc Meeting; R1-1700089; Spokane, USA , Jan. 16-20, 2017.
(Continued)

*Primary Examiner* — Khanh C Tran
(74) *Attorney, Agent, or Firm* — Kilpatrick Townsend & Stockton, LLP

(57) ABSTRACT

Disclosed are a polar code encoding method and device and a polar code decoding method and device. The polar code encoding method comprises: reading a known first sequence; and for an information sequence to be encoded, combining the information sequence with the first sequence, and performing polar code encoding on the combined sequence. In the polar code encoding method provided by embodiments of the present disclosure, a known first
(Continued)

S101
Read a known first sequence

S102
Combine an information sequence to be encoded, with the Known first sequence, and Perform polar code encoding on combined sequence sequence is read and polar code encoding is performed on an information sequence and the first sequence. Thus, polar code encoding on the information sequence to be encoded is implemented, and a new polar code encoding solution is provided.

20 Claims, 3 Drawing Sheets

(51) Int. Cl.
  *H03M 13/13* (2006.01)
  *H03M 13/45* (2006.01)

(58) Field of Classification Search
  CPC .......... H03M 13/3944; H03M 13/1111; H03M 13/2942; H03M 13/45; H04L 1/0057; H04L 1/0058; H04L 1/0009; H04L 1/0067; H04L 1/0046; H04L 1/0065; H04L 1/0014; H04L 1/004; H04L 1/0001; H04L 1/0047; H04L 1/0056; H04L 1/0064; H04L 1/0075; H04L 1/0643
  See application file for complete search history.

(56) References Cited

U.S. PATENT DOCUMENTS

| | | | |
|---|---|---|---|
| 2015/0263767 A1 | 9/2015 | Shin et al. | |
| 2017/0366199 A1* | 12/2017 | Ge | H03M 13/09 |
| 2018/0198560 A1* | 7/2018 | Jiang | H03M 13/13 |
| 2019/0149267 A1* | 5/2019 | Cirkic | H04L 1/0057 714/758 |
| 2019/0349009 A1* | 11/2019 | Zhang | H03M 13/616 |
| 2019/0372711 A1* | 12/2019 | Luo | H04W 72/005 |
| 2019/0394673 A1* | 12/2019 | Hwang | H04L 1/0072 |
| 2020/0021392 A1* | 1/2020 | Xu | H04L 1/0054 |

FOREIGN PATENT DOCUMENTS

| | | |
|---|---|---|
| CN | 104124979 A | 10/2014 |
| CN | 105811998 A | 7/2016 |
| CN | 106161012 A | 11/2016 |
| CN | 107017892 A | 8/2017 |
| CN | 107124188 A | 9/2017 |
| WO | 2016172937 A1 | 11/2016 |

OTHER PUBLICATIONS

MediaTek Inc.; "PBCH Enhancement with Polar Code"; 3GPP TSG RAN WG1 AH_NR Meeting; R1-1700169; Spokane: USA, Jan. 16-20, 2017.

AT&T; "Polar Code Design for DCI"; 3GPP TSG RA WG Meethig #88; R1-1702277; Athens, Greece; Feb. 13-17, 2017.

* cited by examiner

POLAR CODE ENCODING METHOD AND DEVICE AND POLAR CODE DECODING METHOD AND DEVICE

This application is a National Stage of International Application No. PCT/CN2018/076533, filed Feb. 12, 2018, which claims the benefit of Chinese Patent Application No. 201710116484.X, filed with the Chinese Patent Office on Mar. 1, 2017, and entitled "polar code encoding method and device and polar code decoding method and device", both of which are hereby incorporated by reference in their entireties.

FIELD

The present disclosure relates to the field of communications, and particularly to an encoding method and device using polar codes, and a decoding method and device using polar codes.

BACKGROUND

At present, as the 4th Generation (4G) mobile communication technologies have been widely commercialized, global researches have been focused on the future-oriented 5th Generation (5G) mobile communication technologies. It has been commonly desirable in the industry to ascertain a uniform 5G concept, and to establish a globally uniform 5G standard. Polar codes for a control channel encoding scheme in a 5G enhanced Mobile Broad Band (eMBB) scenario relate to a new encoding scheme which can provide a binary symmetric channel capacity and excellent decoding performance.

However, it is highly desirable to address encoding and decoding using polar codes in the 5G standard.

SUMMARY

Embodiments of the disclosure provide an encoding method and device using polar codes, and a decoding method and device using polar codes so as to provide a new encoding and decoding scheme using polar codes.

An embodiment of the disclosure provides an encoding method using polar codes, the method including: reading a known first sequence; and combining an information sequence to be encoded, with the known first sequence, and performing a polar code encoding on combined sequence.

Furthermore, the known first sequence includes: a sequence specified in a protocol, or notified by another device; or a sequence negotiated by a transmitter and a receiver in advance.

Furthermore, before the combining the information sequence with the known first sequence, and performing the polar code encoding on the combined sequence, the method further includes: generating a second sequence according to attribute information of the information sequence to be encoded, in a preset second sequence generation algorithm; and the combining the information sequence with the known first sequence, and performing the polar code encoding on the combined sequence includes: combining the information sequence with the known first sequence and the second sequence, and performing a polar code encoding on combined sequence.

Furthermore, before the combining the information sequence with the known first sequence and the second sequence, and encoding the resulting sequence using polar codes, the method includes at least one of followings: updating the known first sequence in a preset algorithm; and updating the second sequence in the preset algorithm, wherein the preset algorithm includes at least one of an EXOR algorithm, an interleaving algorithm, or an algorithm of updating a preset bit.

Furthermore, the attribute information of the information sequence to be encoded includes: a length of information sequence to be encoded and/or information in the information sequence to be encoded.

Furthermore, the information in the information sequence to be encoded includes: a part of the information in the information sequence to be encoded and/or all of the information in the information sequence to be encoded.

Furthermore, the generating the second sequence according to the attribute information of the information sequence to be encoded, in the preset second sequence generation algorithm includes: generating the second sequence according to the information in the information sequence to be encoded, in a preset Cyclic Redundancy Check (CRC) algorithm; or generating the second sequence according to the information in the information sequence to be encoded, in a preset hash function; or generating the second sequence according to the length of the information sequence to be encoded, in a preset random function.

Furthermore, the generating the second sequence according to the information in the information sequence to be encoded, in the preset Cyclic Redundancy Check (CRC) algorithm includes: generating a sub-sequence according to the information in the information sequence to be encoded, in the preset CRC algorithm, and generating the second sequence according to the information in the information sequence to be encoded, and the sub-sequence in the CRC algorithm; or generating a sub-sequence according to the information in the information sequence to be encoded, in a preset hash function, and generating the second sequence according to the information in the information sequence to be encoded, and the sub-sequence in the CRC algorithm; or generating a sub-sequence according to the length of the information sequence to be encoded, in a preset random function, and generating the second sequence according to the information in the information sequence to be encoded, and the sub-sequence in the CRC algorithm.

Furthermore, the generating the second sequence according to the information in the information sequence to be encoded, in the preset hash function includes: generating a sub-sequence according to the information in the information sequence to be encoded, in a preset CRC algorithm, and generating the second sequence according to the information in the information sequence to be encoded, and the sub-sequence in the preset hash function; or generating a sub-sequence according to the information in the information sequence to be encoded, in the preset hash function, and generating the second sequence according to the information in the information sequence to be encoded, and the sub-sequence in the preset hash function; or generating a sub-sequence according to the length of the information sequence to be encoded, in a preset random function, and generating the second sequence according to the information in the information sequence to be encoded, and the sub-sequence in the preset hash function.

Furthermore, the generating the second sequence according to the attribute information of the information sequence to be encoded, in the preset second sequence generation algorithm includes: generating the second sequence according to the attribute information of the information sequence to be encoded, and the known first sequence in the preset second sequence generation algorithm.

Furthermore, the updating the known first sequence in the preset algorithm, and/or updating the second sequence in the preset algorithm includes: updating the sequence and/or the second sequence using a scrambling sequence.

Furthermore, the length of the second sequence is 10 to 16 bits.

Furthermore, the method further includes: rate-matching polar-code encoded sequence in a pre-stored rate matching algorithm.

An embodiment of the disclosure provides a decoding method using polar codes, the method including: performing Successive Cancellation List (SCL) decoding on a received sequence encoded using polar codes; and determining an information sequence and a first sequence among candidate sequences in a plurality of candidate paths reserved as a result of decoding, reading a known first check sequence in the same way as a transmitter, and determining a decoding result according to the first sequence and the first check sequence.

Furthermore, the known first sequence includes: a sequence specified in a protocol, or notified by another device; or a sequence negotiated by a transmitter and a receiver in advance.

Furthermore, before the determining the decoding result according to the first sequence and the first check sequence, the method further includes:

determining a second sequence among the candidate sequences; and the determining the decoding result according to the first sequence and the first check sequence includes:

generating a second check sequence according to attribute information of the information sequence in a second sequence generation algorithm corresponding to the transmitter; and determining the decoding result according to the first check sequence and the second check sequence, and the corresponding first sequence and second sequence among the candidate sequences.

Furthermore, before the determining the decoding result according to the first check sequence and the second check sequence, and the corresponding first sequence and second sequence among the candidate sequences, the method further includes at least one of followings:

updating the first check sequence in an algorithm corresponding to the transmitter; and updating the second check sequence in the algorithm corresponding to the transmitter, wherein the algorithm corresponding to the transmitter includes at least one of an EXOR algorithm, an interleaving algorithm, or an algorithm of updating a preset bit.

Furthermore, the attribute information of the information sequence includes:

a length of the information sequence to be encoded and/or information in the information sequence to be encoded.

Furthermore, the information in the information sequence to be encoded includes:

a part of the information in the information sequence to be encoded and/or all of the information in the information sequence to be encoded.

Furthermore, the generating the second check sequence according to the attribute information of the information sequence in the second sequence generation algorithm corresponding to the transmitter includes:

generating the second check sequence according to the information in the information sequence in a Cyclic Redundancy Check (CRC) algorithm corresponding to the transmitter; or generating the second check sequence according to the information in the information sequence in a hash function corresponding to the transmitter; or generating the second check sequence according to the length of the information sequence in a random function corresponding to the transmitter.

Furthermore, the generating the second check sequence according to the information in the information sequence in the CRC algorithm corresponding to the transmitter includes:

generating a sub-sequence according to the information in the information sequence in the CRC algorithm corresponding to the transmitter, and generating the second check sequence according to the information in the information sequence, and the sub-sequence in the CRC algorithm; or generating a sub-sequence according to the information in the information sequence in a hash function corresponding to the transmitter, and generating the second check sequence according to the information in the information sequence, and the sub-sequence in the CRC algorithm corresponding to the transmitter; or generating a sub-sequence according to the length of the information sequence in a random function corresponding to the transmitter, and generating the second check sequence according to the information in the information sequence, and the sub-sequence in the CRC algorithm corresponding to the transmitter.

Furthermore, the generating the second check sequence according to the information in the information sequence in the hash function corresponding to the transmitter includes:

generating a sub-sequence according to the information in the information sequence in a CRC algorithm corresponding to the transmitter, and generating the second check sequence according to the information in the information sequence, and the sub-sequence in the hash function corresponding to the transmitter; or generating a sub-sequence according to the information in the information sequence in the hash function corresponding to the transmitter, and generating the second check sequence according to the information in the information sequence, and the sub-sequence in the hash function corresponding to the transmitter; or generating a sub-sequence according to the information in the information sequence in a random function corresponding to the transmitter, and generating the second check sequence according to the information in the information sequence, and the sub-sequence in the hash function corresponding to the transmitter.

Furthermore, the generating the second check sequence according to the attribute information of the information sequence in the second sequence generation algorithm corresponding to the transmitter includes: generating the second check sequence according to the attribute information of the information sequence, and the first sequence in the second sequence generation algorithm corresponding to the transmitter.

Furthermore, the updating the first check sequence in the algorithm corresponding to the transmitter, and/or updating the second check sequence in the algorithm corresponding to the transmitter includes: updating the first check sequence and/or the second check sequence using a scrambling sequence corresponding to the transmitter.

Furthermore, the length of the second sequence is 10 to 16 bits.

Furthermore, the determining the decoding result according to the first check sequence and the second check sequence, and the corresponding first sequence and second sequence among the candidate sequences includes: for candidate sequences in each candidate path, determining whether the first check sequence and the second check sequence are the same as corresponding first and second sequences among the candidate sequences, and if so, then determining the decoding result as an information sequence in the candidate path.

An embodiment of the disclosure provides a polar code encoding device, the device including: a reading module configured to read a known first sequence; and an encoding module configured to combine an information sequence to be encoded, with the known first sequence, and to perform a polar code encoding on combined sequence.

Furthermore, the device further includes: a generating module configured to generate a second sequence according to attribute information of the information sequence to be encoded, in a preset second sequence generation algorithm; and the encoding module is further configured to combine the information sequence with the known first sequence and the second sequence, and to perform a polar code encoding on combined sequence.

Furthermore, the device further includes: an updating module configured to update the known first sequence in a preset algorithm; and/or to update the second sequence in the preset algorithm, wherein the preset algorithm includes at least one of an EXOR algorithm, an interleaving algorithm, or an algorithm of updating a preset bit.

Furthermore, the generating module is configured to generate the second sequence according to information in the information sequence to be encoded, in a preset Cyclic Redundancy Check (CRC) algorithm; or to generate the second sequence according to information in the information sequence to be encoded, in a preset hash function; or to generate the second sequence according to the length of the information sequence to be encoded, in a preset random function.

Furthermore, the generating module is configured to generate a sub-sequence according to the information in the information sequence to be encoded, in the preset CRC algorithm, and to generate the second sequence according to the information in the information sequence to be encoded, and the sub-sequence in the CRC algorithm; or to generate a sub-sequence according to the information in the information sequence to be encoded, in a preset hash function, and to generate the second sequence according to the information in the information sequence to be encoded, and the sub-sequence in the CRC algorithm; or to generate a sub-sequence according to the length of the information sequence to be encoded, in a preset random function, and to generate the second sequence according to the information in the information sequence to be encoded, and the sub-sequence in the CRC algorithm.

Furthermore, the generating module is configured to generate a sub-sequence according to the information in the information sequence to be encoded, in a preset CRC algorithm, and to generate the second sequence according to the information in the information sequence to be encoded, and the sub-sequence in the preset hash function; or to generate a sub-sequence according to the information in the information sequence to be encoded, in a preset hash function, and to generate the second sequence according to the information in the information sequence to be encoded, and the sub-sequence in the preset hash function; or to generate a sub-sequence according to the length of the information sequence to be encoded, in a preset random function, and to generate the second sequence according to the information in the information sequence to be encoded, and the sub-sequence in the preset hash function.

Furthermore, the generating module is configured to generate the second sequence according to the attribute information of the information sequence to be encoded, and the first sequence in the preset second sequence generation algorithm.

Furthermore, the updating module is configured to update the sequence and/or the second sequence using a scrambling sequence.

Furthermore, the device further comprises: a rate matching module configured to rate-match the polar code encoded sequence in a pre-stored rate matching algorithm.

An embodiment of the disclosure provides a polar code decoding device, the device including: a decoding module configured to perform Successive Cancellation List (SCL) decoding on a received sequence encoded using polar codes; and a determining module configured to determine an information sequence and a first sequence among candidate sequences in a plurality of candidate paths reserved as a result of decoding, to read a known first check sequence in a same way as a transmitter, and to determine a decoding result according to the first sequence and the first check sequence.

Furthermore, the determining module is further configured: to determine a second sequence among the candidate sequences; to generate a second check sequence according to attribute information of the information sequence in a second sequence generation algorithm corresponding to the transmitter; and to determine the decoding result according to the first check sequence and the second check sequence, and the corresponding first sequence and second sequence among the candidate sequences.

Furthermore, the device further includes: an updating module configured to update the first check sequence in an algorithm corresponding to the transmitter; and/or to update the second check sequence in the algorithm corresponding to the transmitter, wherein the algorithm corresponding to the transmitter includes at least one of an EXOR algorithm, an interleaving algorithm, or an algorithm of updating a preset bit.

Furthermore, the determining module is configured to generate the second check sequence according to information in the information sequence in a Cyclic Redundancy Check (CRC) algorithm corresponding to the transmitter; or to generate the second check sequence according to information in the information sequence in a hash function corresponding to the transmitter; or to generate the second check sequence according to the length of the information sequence in a random function corresponding to the transmitter.

Furthermore, the determining module is configured to generate a sub-sequence according to the information in the information sequence in the CRC algorithm corresponding to the transmitter, and to generate the second check sequence according to the information in the information sequence, and the sub-sequence in the CRC algorithm; or to generate a sub-sequence according to the information in the information sequence in a hash function corresponding to the transmitter, and to generate the second check sequence according to the information in the information sequence, and the sub-sequence in the CRC algorithm corresponding to the transmitter; or to generate a sub-sequence according to the length of the information sequence in a random function corresponding to the transmitter, and to generate the second check sequence according to the information in the information sequence, and the sub-sequence in the CRC algorithm corresponding to the transmitter.

Furthermore, the determining module is configured to generate a sub-sequence according to the information in the information sequence in a CRC algorithm corresponding to the transmitter, and to generate the second check sequence according to the information in the information sequence, and the sub-sequence in the hash function corresponding to the transmitter; or to generate a sub-sequence according to the information in the information sequence in the hash function corresponding to the transmitter, and to generate the second check sequence according to the information in the information sequence, and the sub-sequence in the hash function corresponding to the transmitter; or to generate a sub-sequence according to the information in the information sequence in a random function corresponding to the transmitter, and to generate the second check sequence according to the information in the information sequence, and the sub-sequence in the hash function corresponding to the transmitter.

Furthermore, the determining module is configured to generate the second check sequence according to the attribute information of the information sequence, and the first sequence in the second sequence generation algorithm corresponding to the transmitter.

Furthermore, the updating module is configured to update the first check sequence and/or the second check sequence using a scrambling sequence corresponding to the transmitter.

Furthermore, the determining module is configured, for candidate sequences in each candidate path, to determine whether the first check sequence and the second check sequence are the same as corresponding first and second sequences among the candidate sequences, and if so, to determine the decoding result as an information sequence in the candidate path.

An embodiment of the disclosure provides an encoding method using polar codes, where the method includes: reading a known first sequence; and combining an information sequence to be encoded, with the known first sequence, and performing a polar code encoding on combined sequence. In the encoding method and device using polar codes according to the embodiment of the disclosure, a known first sequence is read, and then an information sequence and the first sequence are encoded using polar codes, so that the information sequence to be encoded are encoded using polar codes, and there is provided a new solution to encoding using polar codes.

DETAILED DESCRIPTION OF THE EMBODIMENTS

Figure 1:
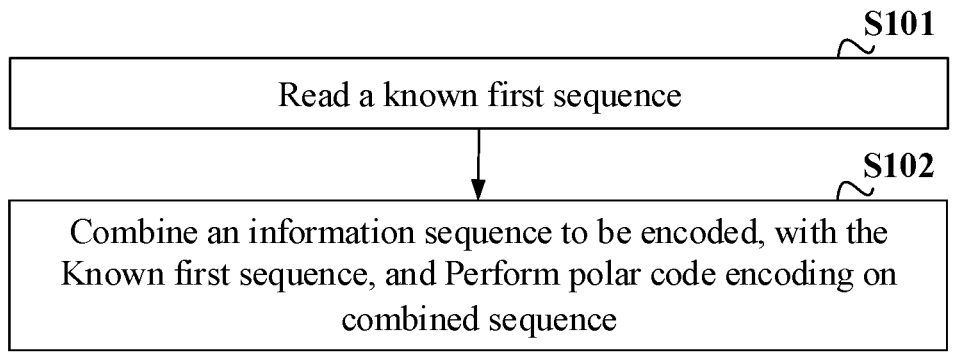
FIG. 1 is a schematic flow chart of an encoding method using polar codes according to a first embodiment of the disclosure.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments to be described below are only a part but not all of the embodiments of the disclosure. Based upon the embodiments here of the disclosure, all the other embodiments which can occur to those ordinarily skilled in the art without any inventive effort shall fall into the scope of the disclosure.

It shall be appreciated that the technical solutions according to the embodiments of the disclosure can be applicable to various communication systems, e.g., a Global System of Mobile communication (GSM) system, a Code Division Multiple Access (CDMA) system, a Wideband Code Division Multiple Access (WCDMA) system, a General Packet Radio Service (GPRS) system, a Long Term Evolution (LTE) system, a Long Term Evolution-Advanced (LTE-A) system, a Universal Mobile Telecommunication System (UMTS), a New Radio (NR), etc.

It shall be further appreciated that in the embodiments of the disclosure, a User Equipment (UE) includes but will not be limited to a Mobile Station (MS), a mobile terminal, a mobile telephone, a handset, a portable equipment, etc., and the user equipment can communicate with one or more core networks over a Radio Access Network (RAN). For example, the user equipment can be a mobile phone (referred to as a "cellular" phone), a computer with a function of radio communication, etc., and the user equipment can also be a portable, pocket, handheld, built-in-computer, or on-vehicle mobile device.

In the embodiments of the disclosure, a base station (e.g., an access point) can be such a device in an access network that communicates with a radio terminal over one or more sectors via an air interface. The base station can be configured to convert a received air frame into an IP packet, and a received IP packet into an air frame, and operate as a router between the radio terminal, and the remaining components of the access network, where the remaining components of the access network can include an Internet Protocol (IP) network. The base station can further coordinate attribute management on the air interface, and for example, the base station can be a Base Communication module Station (BTS) in a GSM or CDMA system, or can be a base station (Node B) in a TD-SCDMA or WCDMA system, or can be an evolved base station (eNodeB or eNB or e-NodeB, evolutional Node B) in an LTE system, or can be a base station (gNB) the 5G NR, although the disclosure will not be limited thereto.

In order to make the objects, technical solutions, and advantages of the disclosure more apparent, the disclosure will be described below in further details with reference to the drawings, and apparently the embodiments to be described below are only a part but not all of the embodiments of the disclosure. Based upon the embodiments here of the disclosure, all the other embodiments which can occur to those ordinarily skilled in the art without any inventive effort shall fall into the scope of the disclosure.

First Embodiment

FIG. 1 is a schematic flow chart of an encoding method using polar codes according to an embodiment of the disclosure, where the method includes the followings steps.

The step S101 is to read a known first sequence.

The encoding method using polar codes according to the embodiment of the disclosure is applicable to a transmitter, and particularly the transmitter can be a base station or a User Equipment (UE).

While an information sequence encoded using polar codes is being transmitted between a receiver and the transmitter over multiple paths corresponding to a channel, an information frame corresponding to the information sequence encoded using polar codes may be transmitted in error, and in order to enable the receiver to determine a decoding result accurately, the known first sequence is preset in the embodiment of the disclosure for the receiver to check for accuracy the information sequence, encoded using polar codes, transmitted over the different paths.

In the embodiment of the disclosure, the known first sequence is preset, where the first sequence can be a sequence preset at the transmitter and the receiver, or can be a sequence predetermined as a result of negotiation between the transmitter and the receiver.

The step S102 is to combine an information sequence to be encoded, with the known first sequence, and to encode a combined sequence using polar codes.

The information sequence and the first sequence can be encoded using polar codes by combing the information sequence with the first sequence, and further encoding the information sequence and the information sequence by an encoder using polar codes. In one embodiment, the information sequence and the first sequence can be combined, that is, parallel-to-serial conversion can be performed on the information sequence and the first sequence, by arranging bits in the information sequence as more reliable bits, i.e., a sub-channel, and arranging bits in the first sequence as less reliable bits. For example, the bits in the first sequence can be arranged as frozen bits. The bits can be encoded using polar codes as in the prior art, so a repeated description thereof will be omitted in the embodiment of the disclosure.

Particularly, the transmitter encodes the sequence using polar codes by mapping the information sequence and the first sequence respectively onto sub-channels with different bit channel capacities to map the information sequence and the first sequence onto a bit channel, arranging positions corresponding to the other sub-channels as frozen positions "0", and then encoding the sequence using polar codes. Particularly which information is mapped onto which sub-channel is known to the transmitter. The receiver shall determine the information sequence and the first sequence among candidate sequences by determining the information sequence and the first sequence among the candidate sequences according to a mapping scheme corresponding to the transmitter. Particularly the receiver also knows the mapping scheme of the transmitter in advance, that is, the receiver knows which information is mapped onto which sub-channel is known, so the receiver can determine the information sequence and the first sequence over candidate paths after decoding.

After the sequence into which the information sequence and the first sequence are combined is encoded using polar codes, the sequence is further modulated by a modulator, and transmitted to the receiver, i.e., a decoder.

In the encoding method using polar codes according to the embodiment of the disclosure, the known first sequence is red, and then the information sequence and the first sequence are encoded using polar codes, so that the information sequence to be encoded is encoded using polar codes.

Second Embodiment

In order to lower a bit error ratio in effect, further to the embodiment above, the known first sequence in the present embodiment of the disclosure includes:

a sequence specified in a protocol, or notified by another device; or a sequence negotiated by the transmitter and the receiver in advance.

In the embodiment of the disclosure, the known first sequence can be a fixed sequence specified in a protocol, or notified by another device, or can be a part or all of identification information of the transmitter or the receiver as specified in a protocol, or notified by another device. Of course, the first sequence can alternatively be generated in a first sequence generation algorithm specified in a protocol, or notified by another device. For example, a sequence can be generated as the first sequence according to identification information of the transmitter in a first sequence generation algorithm specified in a protocol, or notified by another device, or a sequence table in which first sequences corresponding to respective periods of time are recorded can be stored in the transmitter, and the transmitter can determine the first sequence corresponding to the current period of time, where there may be the same or different first sequences corresponding to the respective periods of time as long as the receiver can also determine the same first sequence as the transmitter in the same way as the transmitter determines the first sequence.

Alternatively the transmitter and the receiver can negotiate about the first sequence in advance, and for example, the receiver and the transmitter can negotiate about a fixed sequence as the first sequence, or the receiver and the transmitter can negotiate about determining a part or all of identification information of the transmitter or the receiver as the first sequence. Of course, the receiver and the transmitter can alternatively negotiate about a first sequence generation algorithm, and the first sequence can be generated in the first sequence generation algorithm.

Third Embodiment

In the existing decoding using polar codes, in order to improve the performance of decoding using polar codes, generally the Successive Cancellation list (SCL) decoding algorithm is applied. For Cyclic Redundancy Check (CRC) aided polar codes, a list decoding path is selected using appended CRC bits, thus resulting in a higher false alarm ratio. If $P_{fa,path}$ is a false alarm ratio determined by N CRC bits, then in the CRC aided decoding algorithm with a list size L, each L path will be checked and selected using CRC in the worst case, so that the false alarm ratio is $P_{fa,block}=1-(1-P_{fa,block})^L$, and increases as increasing L.

For parity Check (PC) aided encoding and decoding using polar codes, the last appended N bits are only used for error detection but not for selecting a path, so a false alarm ratio will not be degraded, but there is a higher overhead of check bits in PC aided encoding and decoding using polar codes, thus degrading the performance of a Block Error Ratio (BLER).

In order to lower a false alarm ratio in effect, further to the respective embodiment above, before the information sequence is combined with the first sequence, and the resulting sequence is encoded using polar codes, the method in the present embodiment of the disclosure further includes the following step:

generating a second sequence according to attribute information of the information sequence to be encoded, in a preset second sequence generation algorithm; and combining the information sequence with the first sequence, and encoding the resulting sequence using polar codes includes the following step:

combining the information sequence with the known first sequence and the second sequence, and performing a polar code encoding on combined sequence.

The length of the second sequence is 10 to 16 bits.

In the existing LTE system, a false alarm ratio required of a control channel is 16 bits, and this required false alarm ratio will be stored in a 5G system, so the length of the second sequence shall be calculated as 16 bits given the required false alarm ratio, so a path cannot be selected for the second sequence. In order to select a path, the length of the second sequence is generally no less than 16+5=21 bits. In the embodiment of the disclosure, the first sequence and the second sequence are calculated from the information sequence, and since the first sequence is known but not used for aided decoding, the false alarm ratio can be guaranteed instead of being degraded, but also the length of the second sequence can be reduced in effect due to the first sequence to thereby lower the error bit ratio so as to improve the accuracy of transmitting the polar-encoded sequence at the transmitter and the receiver.

Particularly, the second sequence generation algorithm is stored in advance in the transmitter, and when the transmitter needs to polar-encode the information sequence to be encoded, the transmitter can generate the second sequence according to the attribute information of the information sequence to be encoded, in the pre-stored second sequence generation algorithm. The transmitter can encode the sequence using polar codes by mapping the information sequence, the first sequence, and the second sequence respectively onto sub-channels with different bit channel capacities to map the information sequence, the first sequence, and the second sequence onto a bit channel, arranging positions corresponding to the other sub-channels as frozen positions "0", and then encoding the sequence using polar codes. Particularly which information is mapped onto which sub-channel is known to the transmitter.

The attribute information of the information sequence to be encoded includes:

the length of and/or information in the information sequence to be encoded.

The information in the information sequence to be encoded includes:

a part or all of the information in the information sequence to be encoded.

Particularly, the attribute information of the information sequence to be encoded can be the length of the information sequence to be encoded, or can be the information in the information sequence to be encoded, or can be the length of and the information in the information sequence to be encoded. The information in the information sequence to be encoded can include a part of the information in the information sequence to be encoded, or can be all the information in the information sequence to be encoded.

The information sequence, the first sequence, and the second sequence can be encoded using polar codes by combing the information sequence, the first sequence, and the second sequence, and further encoding the information sequence, the first sequence, and the second sequence by an encoder using polar codes. In one embodiment, the information sequence, the first sequence, and the second sequence can be combined, that is, parallel-to-serial conversion can be performed on the information sequence, the first sequence, and the second sequence, by arranging bits in the information sequence as the most reliable bits, i.e., a sub-channel, arranging bits in the first sequence as the second most reliable bits, and arranging bits in the second sequence as less reliable bits; or by arranging bits in the information sequence as the most reliable bits, i.e., a sub-channel, arranging bits in the second sequence as the second most reliable bits, and arranging bits in the first sequence as less reliable bits. For example, the bits in the first sequence, and the bits in the second sequence can be arranged as frozen bits.

The bits can be encoded using polar codes as in the prior art, so a repeated description thereof will be omitted in the embodiment of the disclosure.

After the information sequence, the first sequence, and the second sequence are encoded using polar codes, they are further modulated by a modulator, and transmitted to the receiver, i.e., a decoder.

Fourth Embodiment

In order to further lower a false alarm ratio, further to the respective embodiments above, before the information sequence, the first sequence, and the second sequence are combined, and the resulting sequence is encoded using polar codes, the method in the present embodiment of the disclosure further includes the following step:

updating the known first sequence in a preset algorithm; and/or updating the second sequence in the preset algorithm, where the preset algorithm includes at least one of an EXOR algorithm, an interleaving algorithm, or an algorithm of updating a preset bit.

In the embodiment of the disclosure, the algorithm of updating the sequence or sequences is stored in the transmitter, and before the information sequence, the first sequence, and the second sequence are encoded using polar codes, the sequence or sequences can be updated in the preset algorithm. Only the first sequence can be updated in the preset algorithm, or only the second sequence can be updated in the preset algorithm, or both the first sequence and the second sequence can be updated in the preset algorithm.

When both the first sequence and the second sequence are updated in the preset algorithm, particularly firstly the first sequence can be updated before the second sequence is generated, and then the second sequence can be updated after the second sequence is generated, or r both the first sequence and the second sequence can be updated after the second sequence is generated, and before the information sequence, the first sequence, and the second sequence are encoded using polar codes.

Here the preset algorithm includes at least one of an EXOR algorithm, an interleaving algorithm, or an algorithm of updating a preset bit, and the first sequence and the second sequence can be updated in the same or different algorithms.

For example, the first sequence can be updated in an interleaving algorithm, and the second sequence can be updated in an algorithm of updating a preset bit, or the first sequence can be updated in an EXOR algorithm and an interleaving algorithm, and the second sequence can be updated in an interleaving algorithm, and an algorithm of updating a preset bit.

The updating the known first sequence in the preset algorithm, and/or updating the second sequence in the preset algorithm includes the following step:

updating the known first sequence and/or the second sequence using a scrambling sequence.

Downlink Control Information (DCI) in an LTE downlink control channel shall be scrambled using a scrambling sequence, and particularly the scrambling sequence can be a UE ID; and for example, the first sequence and/or the second sequence can be scrambled using the scrambling sequence. For example, the scrambling sequence can be EXORed with the first sequence and/or the second sequence to represent implicitly a target user to which the DCI is to be transmitted. Accordingly the scrambling process is actually a particular implementation of updating the known first sequence and/or the second sequence. However the scrambling process is applicable to an LTE downlink control channel, but the embodiment of the disclosure will not be limited to this scenario, and the first sequence and/or the second sequence can also be updated in other scenarios.

Since there are two sequences, only one of the sequences can be updated by being scrambled, or both of the sequences can be updated by being scrambled. Particularly only the first sequence can be scrambled using the UE ID, and for example, the first sequence is a hash sequence, and the hash sequence can be scrambled by scrambling the 8-bit hash sequence using the 8-bit UE ID. Of course, the length of the UE ID, which is 8 bits, is only an example in which the length thereof is no more than the length of the hash sequence.

If the length of the UE ID is more than the length of the hash sequence, and also more than the length of the second sequence which is a CRC sequence, then the UE ID may be divided into two segments in a preset scheme, and the first sequence, i.e., the hash sequence, and the second sequence, i.e., the CRC sequence, may be scrambled respectively using the two segments; and for example, the first segment of the UE ID is of the same length as the hash sequence, the hash sequence is scrambled using the first segment, and the second sequence is scrambled using the remaining bits of the UE ID.

Uplink Control Information (UCI) in an uplink control channel can be processed in the same way as the DCI.

Fifth Embodiment

Further to the respective embodiments above, generating the second sequence in the present embodiment of the disclosure includes the following implementations.

In a first implementation:

the generating the second sequence according to the attribute information of the information sequence to be encoded, in the preset second sequence generation algorithm includes the following step:

generating the second sequence according to the information in the information sequence to be encoded, in a preset Cyclic Redundancy Check (CRC) algorithm; or generating the second sequence according to the information in the information sequence to be encoded, in a preset hash function; or generating the second sequence according to the length of the information sequence to be encoded, in a preset random function.

In the embodiment of the disclosure, when the attribute information of the information sequence to be encoded is information in the information sequence to be encoded, the second sequence generation algorithm stored in advance in the transmitter can be a CRC algorithm, and the second sequence can be generated by generating the second sequence according to the information in the information sequence to be encoded, in the CRC algorithm; and when the second sequence generation algorithm stored in advance in the transmitter can be a hash algorithm, and the second sequence can be generated by generating the second sequence according to the information in the information sequence to be encoded, in the hash algorithm; and when the attribute information of the information sequence to be encoded is the length of the information sequence to be encoded, the second sequence generation algorithm stored in advance in the transmitter can be a random algorithm, and the second sequence can be generated by generating the second sequence according to the length of the information sequence to be encoded, in the preset random algorithm.

When the attribute information of the information sequence to be encoded is information in, and the length of the information sequence to be encoded, the second sequence generation algorithm stored in advance in the transmitter can be a CRC algorithm or a hash algorithm, and the second sequence can be generated by generating the second sequence according to the information in the information sequence to be encoded, in the CRC algorithm or the hash algorithm, where the length of the information sequence to be encoded is a part of the information in the information sequence to be encoded.

In a second implementation:

the generating the second sequence according to the attribute information of the information sequence to be encoded, in the preset second sequence generation algorithm includes the following step:

generating the second sequence according to the attribute information of the information sequence to be encoded, and the known first sequence in the preset second sequence generation algorithm.

The second sequence can be generated by generating the second sequence according to the attribute information of the information sequence to be encoded, and the known first sequence in the preset second sequence generation algorithm. For example, the attribute information of the information sequence to be encoded can be combined with the first sequence, and the second sequence can be generated according to a resulting sequence in the preset second sequence generation algorithm.

For example, the second sequence generation algorithm is a CRC algorithm, so the information sequence can be combined with the first sequence in any way, and for example, the information sequence can precede to the first sequence, or the first sequence can be inserted into the information sequence, and the second sequence can be generated according to a resulting sequence in the CRC algorithm; and when the second sequence generation algorithm is a hash algorithm, so the information sequence can be combined with the first sequence in any way, and for example, the information sequence can precede to the first sequence, or the first sequence can precede to the information sequence, or the first sequence can be inserted into the information sequence, and the second sequence can be generated according to a resulting sequence in the hash algorithm.

Sixth Embodiment

In order to transmit a code word accurately, further to the respective embodiments above, the generating the second sequence according to the information in the information sequence to be encoded, in the preset Cyclic Redundancy Check (CRC) algorithm in the present embodiment of the disclosure includes the following step:

generating a sub-sequence according to the information in the information sequence to be encoded, in the preset CRC algorithm, and generating the second sequence according to the information in the information sequence to be encoded, and the sub-sequence in the CRC algorithm; or generating a sub-sequence according to the information in the information sequence to be encoded, in a preset hash function, and generating the second sequence according to the information in the information sequence to be encoded, and the sub-sequence in the CRC algorithm; or generating a sub-sequence according to the length of the information sequence to be encoded, in a preset random function, and generating the second sequence according to the information in the information sequence to be encoded, and the sub-sequence in the CRC algorithm.

Particularly, the second sequence can be generated by generating a sub-sequence according to the information in the information sequence to be encoded, in the preset CRC algorithm, and then generating the second sequence according to the information in the information sequence to be encoded, and the sub-sequence in the CRC algorithm; or the second sequence can be generated by generating a sub-sequence according to the information in the information sequence to be encoded, in a preset hash function, and then generating the second sequence according to the information in the information sequence to be encoded, and the sub-sequence in the CRC algorithm; or the second sequence can be generated by generating a sub-sequence according to the length of the information sequence to be encoded, in a preset random function, and then generating the second sequence according to the information in the information sequence to be encoded, and the sub-sequence in the CRC algorithm.

Figure 2:
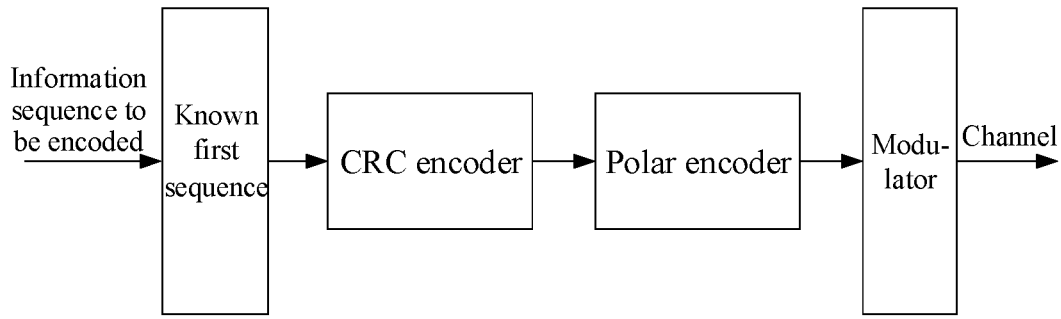
FIG. 2 is a schematic flow chart of an encoding process using polar codes according to a sixth embodiment of the disclosure.

FIG. 2 is a schematic flow chart of an encoding process using polar codes according to an embodiment of the disclosure, where a known first sequence is read, an information sequence to be encoded is encoded by a CRC encoder, the information sequence is CRC-processed to generate a second sequence corresponding to the information sequence, and the first sequence and the second sequence are fed into a polar encoder, encoded using polar codes, then modulated by a modulator, and further transmitted to a receiver over a channel.

Seventh Embodiment

In order to transmit a code word accurately, further to the respective embodiments above, the generating the second sequence according to the information in the information sequence to be encoded, in the preset hash function in the present embodiment of the disclosure includes the following step:

generating a sub-sequence according to the information in the information sequence to be encoded, in a preset CRC algorithm, and generating the second sequence according to the information in the information sequence to be encoded, and the sub-sequence in the preset hash function; or generating a sub-sequence according to the information in the information sequence to be encoded, in the preset hash function, and generating the second sequence according to the information in the information sequence to be encoded, and the sub-sequence in the preset hash function; or generating a sub-sequence according to the length of the information sequence to be encoded, in a preset random function, and generating the second sequence according to the information in the information sequence to be encoded, and the sub-sequence in the preset hash function.

In the embodiment of the disclosure, the second sequence can be generated according to the information in the information sequence to be encoded, in the preset hash function by firstly generating a sub-sequence according to the information in the information sequence to be encoded, in a preset CRC algorithm, and then generating the second sequence according to the information in the information sequence to be encoded, and the sub-sequence in the preset hash function; or by firstly generating a sub-sequence according to the information in the information sequence to be encoded, in the preset hash function, and then generating the second sequence according to the information in the information sequence to be encoded, and the sub-sequence in the preset hash function; or by firstly generating a sub-sequence according to the length of the information sequence to be encoded, in a preset random function, and then generating the second sequence according to the information in the information sequence to be encoded, and the sub-sequence in the preset hash function.

Particularly, the second sequence can be generated according to the information in the information sequence to be encoded, in the preset hash function in such way that firstly the information sequence can be combined with the sub-sequence in any way, and for example, the information sequence can precede to the sub-sequence, or the sub-sequence can be inserted into the information sequence, and the second sequence can be generated according to a resulting sequence in the hash function.

Eighth Embodiment

There is a specified length in bits corresponding to a sequence to be transmitted over a channel due to a limited capacity of the channel, and in order to transmit normally the sequence encoded using polar codes, further to the respective embodiments above, the method in the present embodiment of the disclosure further includes the following step:

rate-matching the sequence encoded using polar codes, in a pre-stored rate matching algorithm.

Particularly, the rate matching algorithm is stored in advance in the transmitter, and a rate matching sequence for rate matching can be determined in a Gaussian scheme, or can be another rate matching sequence insensitive to a Signal Noise Ratio (SNR), where rate matching involves a repetition rule and a puncturing rule. For the polar-encoded sequence, if the number of bits in the sequence encoded using polar codes is less than the limited number of bits over a channel, then the sequence will be repeated, that is, a part of the bits in the polar-encoded sequence will be repeated under the preset repetition rule; and if the number of bits in the sequence encoded using polar codes is more than the limited number of bits over a channel, then the sequence will be punctured, that is, a part of the bits in the polar-encoded sequence will be removed. In the embodiment of the disclosure, the sequence encoded using polar codes can be rate-matched in the pre-stored rate matching algorithm as in the prior art, so a repeated description thereof will be omitted here.

Ninth Embodiment

Figure 3:
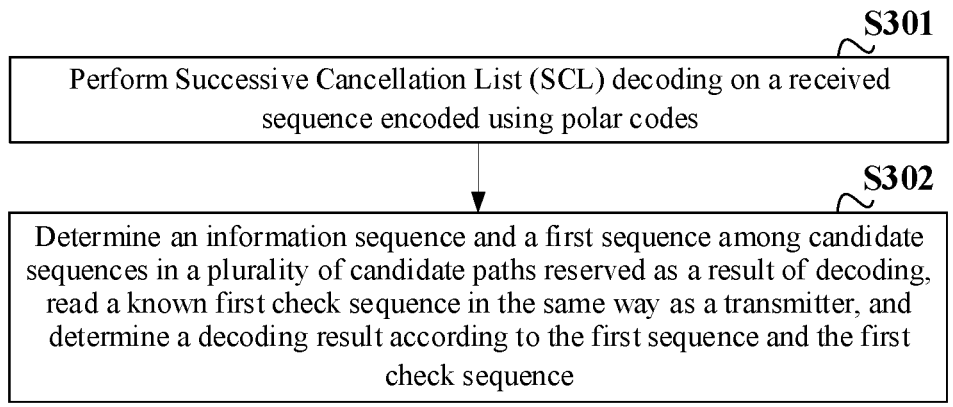
FIG. 3 is a schematic flow chart of a decoding process using polar codes according to a ninth embodiment of the disclosure.

FIG. 3 is a schematic flow chart of a decoding process using polar codes according to an embodiment of the disclosure, where the process includes the following steps:

the step S301 is to perform Successive Cancellation List (SCL) decoding on a received sequence encoded using polar codes.

The decoding method using polar codes according to the embodiment of the disclosure is applicable to a receiver, and particularly the receiver can be a base station or a UE.

Typically, the sequence encoded using polar codes is redundancy-removed and modulated, and then transmitted, and the receiver receives a code word, demodulates the cord word, supplements the cord word with a redundancy, and then determines the sequence encoded using polar codes, corresponding to the received code word.

SCL decoding can be performed on the received sequence encoded using polar codes as in the prior art, so a repeated description thereof will be omitted here. After the sequence encoded using polar codes is SCL-decoded, a plurality of candidate paths, each of which includes the corresponding sequence encoded using polar codes, are reserved under a preset rule.

The step S302 is to determine an information sequence and a first sequence among candidate sequences in a plurality of candidate paths reserved as a result of decoding, to read a known first check sequence in the same way as a transmitter, and to determine a decoding result according to the first sequence and the first check sequence.

In the embodiment of the disclosure, the first check sequence known to the receiver is the same as a first sequence known to the transmitter, where the first check sequence can be a sequence preset at the transmitter and the receiver, or can be a sequence determined as a result of negotiation between the transmitter and the receiver.

Different sequences may be determined according to the information sequence and the first sequence in different encoding schemes, and in order to make the decoding result more accurate, the information sequence and the first sequence shall be determined among the candidate sequences in the same encoding scheme as encoding using polar codes, that is, the information sequence and the first sequence shall be determined among the candidate sequences in the same process as the process of determining an information sequence and a first sequence among candidate sequences during encoding using polar codes. For each reserved candidate path, if the first sequence corresponding to the candidate path is the same as the first check sequence, the candidate path is determined as a decoding path, and the information sequence corresponding to the candidate path is determined as a decoding result.

In the decoding method using polar codes according to the embodiment of the disclosure, for the information sequence and the first sequence in each candidate path as a result of SCL decoding, the decoding path is selected according to the first sequence, and the first check sequence known to the receiver, and the information sequence corresponding to the decoding path is determined as a decoding result, so that the sequence encoded using polar codes are decoded using polar codes.

Tenth Embodiment

In order to lower a bit error ratio in effect, further to the embodiment above, the known first check sequence in the present embodiment of the disclosure includes:

a sequence specified in a protocol, or notified by another device; or a sequence negotiated by the transmitter and the receiver in advance.

In the embodiment of the disclosure, the known first check sequence can be a fixed sequence specified in a protocol, or notified by another device, or can be a part or all of identification information of the transmitter or the receiver as specified in a protocol, or notified by another device. Of course, the first check sequence can alternatively be generated in a first sequence generation algorithm specified in a protocol, or notified by another device. For example, a sequence can be generated as the first check sequence according to identification information of the transmitter in a first check sequence generation algorithm specified in a protocol, or notified by another device, or the same sequence table as the transmitter, in which first check sequences corresponding to respective periods of time are recorded, can be stored in the receiver, and the receiver can determine the first check sequence corresponding to the current period of time, where there may be the same or different first check sequences corresponding to the respective periods of time as long as the receiver can determine the same first check sequence as the first sequence corresponding to the transmitter in the same way as the transmitter determines the first sequence.

Alternatively, the transmitter and the receiver can negotiate about the first check sequence in advance, and for example, the receiver and the transmitter can negotiate about a fixed sequence as the first check sequence, or the receiver and the transmitter can negotiate about determining a part or all of identification information of the transmitter or the receiver as the first check sequence. Of course, the receiver and the transmitter can alternatively negotiate about a first check sequence generation algorithm, and the first check sequence can be generated in the first check sequence generation algorithm.

Here the first check sequence determined by the receiver as specified in the protocol or notified by the other device, or as negotiated by the transmitter and the receiver in advance is the same as the first sequence determined by the transmitter as specified in the protocol or notified by the other device, or as negotiated by the transmitter and the receiver in advance.

Eleventh Embodiment

In order to lower a false alarm ratio in effect, further to the respective embodiment above, before the decoding result is determined according to the first sequence and the first check sequence, the method in the present embodiment of the disclosure further includes the following step:

determining a second sequence among the candidate sequences; and determining the decoding result according to the first sequence and the first check sequence includes the following step:

generating a second check sequence according to attribute information of the information sequence in a second sequence generation algorithm corresponding to the transmitter; and determining the decoding result according to the first check sequence and the second check sequence, and the corresponding first sequence and second sequence among the candidate sequences.

The length of the second check sequence is 10 to 16 bits.

In the existing LTE system, a false alarm ratio required of a control channel is 16 bits, and this required false alarm ratio will be stored in a 5G system, so the length of the second sequence shall be calculated as 16 bits given the required false alarm ratio, so a path cannot be selected for the second sequence. In order to select a path, the length of the second sequence is generally no less than 16+5=21 bits. In the embodiment of the disclosure, the first sequence and the second sequence are calculated from the information sequence, and while the false alarm ratio is being guaranteed, the length of the second sequence can be reduced in effect due to the first sequence to thereby lower an error bit ratio so as to improve the accuracy of transmitting the polar-encoded sequence at the transmitter and the receiver.

Particularly, the receiver needs to determine the information sequence, the first sequence, and the second sequence among the candidate sequences by determining the information sequence, the first sequence, and the second sequence among the candidate sequences in a mapping scheme corresponding to the transmitter. Particularly the receiver also knows the mapping scheme of the transmitter in advance, that is, the receiver knows which information is mapped onto which sub-channel, so the receiver can determine the information sequence, the first sequence, and the second sequence among the candidate sequences after decoding. A second sequence generation algorithm corresponding to the transmitter is also stored in the receiver in advance, and when the receiver needs to check the second sequence corresponding to the candidate sequences, the receiver generates the second check sequence according to the attribute information of the information sequence in the second sequence generation algorithm corresponding to the transmitter.

The attribute information of the information sequence includes: the length of and/or information in the information sequence.

The information in the information sequence includes:

a part or all of the information in the information sequence.

In the embodiment of the disclosure, the attribute information of the information sequence can be the length of the information sequence, or can be the information in the information sequence, or can be the length of and the information in the information sequence. The information in the information sequence can include a part of the information in the information sequence, or can be all the information in the information sequence as long as the attribute information of the information sequence is the same as corresponding attribute information of the information sequence of the transmitter.

Different sequences may be determined according to the information sequence, the first sequence, and the second sequence in different encoding schemes, and in order to make the decoding result more accurate, the information sequence, the first sequence, and the second sequence shall be determined among the candidate sequences in the same encoding scheme as encoding using polar codes, that is, the information sequence, the first sequence, and the second sequence shall be determined among the candidate sequences in the same process as the process of determining an information sequence, a first sequence, and a second sequence among candidate sequences during encoding using polar codes.

Twelfth Embodiment

In order to further lower a false alarm ratio, further to the respective embodiments above, before the decoding result is determined according to the first check sequence and the second check sequence, and the corresponding first sequence and second sequence among the candidate sequences, the method in the present embodiment of the disclosure further includes the following step:

updating the first check sequence in an algorithm corresponding to the transmitter; and/or updating the second check sequence in the algorithm corresponding to the transmitter, where the algorithm corresponding to the transmitter includes at least one of an EXOR algorithm, an interleaving algorithm, and an algorithm of updating a preset bit.

In the embodiment of the disclosure, the algorithm of updating the check sequence or sequences, corresponding to the receiver is stored in advance in the receive, and before the decoding result is determined according to the first check sequence and the second check sequence, and the corresponding first sequence and second sequence among the candidate sequences, the receiver can update the check sequence or sequences in the updating algorithm corresponding to the transmitter. In order to update the check sequence or sequences, if the transmitter updates only the first sequence in a preset algorithm, then the receiver will update the first check sequence in the algorithm corresponding to the transmitter; if the transmitter updates only the second sequence in a preset algorithm, then the receiver will update the second check sequence in the algorithm corresponding to the transmitter; and if the transmitter updates both the first sequence and the second sequence in the same or different preset algorithm or algorithms, then the receiver will update the first check sequence in the algorithm of updating the known first sequence, corresponding to the transmitter, and update the second check sequence in the algorithm of updating the second sequence, corresponding to the transmitter.

For example, if the transmitter updates the first sequence in an interleaving algorithm, and updates the second sequence in an algorithm of updating a preset bit, then the receiver will update the first check sequence in the interleaving algorithm, and update the second check sequence in the algorithm of updating a preset bit; and if the transmitter updates the first sequence in an EXOR algorithm, and updates the second sequence in an interleaving algorithm, then the receiver will update the first check sequence in the EXOR algorithm, and update the second check sequence in the interleaving algorithm.

In the embodiment of the disclosure, the receiver updates the first check sequence and the second check sequence in the same order as the transmitter updates the first sequence and the second sequence, and for example, if the transmitter firstly updates the first sequence before the second sequence is generated, and then updates the second sequence after the second sequence is generated, then the receiver will firstly update the first check sequence before the second check sequence is generated, and then update the second check sequence after the second check sequence is updated, where the algorithm corresponding to the transmitter includes at least one of an EXOR algorithm, an interleaving algorithm, and an algorithm of updating a preset bit.

The updating the first check sequence in the algorithm corresponding to the transmitter, and/or updating the second check sequence in the algorithm corresponding to the transmitter includes:

updating the first check sequence and/or the second check sequence using a scrambling sequence corresponding to the transmitter.

Since the transmitter may update the known first sequence and/or the second sequence in the preset algorithm by updating the known first sequence and/or the second sequence using a scrambling sequence, in order to make the obtained first check sequence and/or second check sequence more accurate, and to make the decoding result more accurate, the receiver needs to update the first check sequence in the algorithm corresponding to the transmitter, and/or to update the second check sequence in the algorithm corresponding to the transmitter, by updating the first check sequence and/or the second check sequence using the scrambling sequence corresponding to the transmitter.

Since there are two check sequences, if the transmitter scrambles only one of the sequences, and for example, scrambles the first sequence which is an 8-bit hash sequence, using an 8-bit UE ID, then the receiver will scramble the second check sequence which is an 8-bit hash sequence, using the 8-bit UE ID corresponding to the transmitter.

Of course, the length of the UE ID, which is 8 bits, is only an example in which the length thereof is no more than the length of the hash sequence, and if the length of the UE ID is more than the length of the hash sequence, and also more than the length of the second sequence which is a CRC sequence, then the transmitter will divide the UE ID into two segments in a preset scheme, and scramble the first sequence, i.e., the hash sequence, and the second sequence, i.e., the CRC sequence, respectively using the two segments. For example, the first segment of the UE ID is of the same length as the hash sequence, the hash sequence is scrambled using the first segment, and the CRC sequence is scrambled using the remaining bits of the UE ID.

Accordingly, the receiver divides the UE ID corresponding to the transmitter in the same scheme as the transmitter, and scrambles the first check sequence, i.e., the hash sequence, and the second check sequence, i.e., the CRC sequence, respectively using the two segments. For example, the first segment of the UE ID is of the same length as the first check sequence, i.e., the hash sequence, the first check sequence, i.e., the hash sequence, is scrambled using the first segment, and the second check sequence, i.e., the CRC sequence, is scrambled using the remaining bits of the UE ID.

Uplink Control Information (UCI) in an uplink control channel can be processed in the same way as the DCI.

Thirteenth Embodiment

Further to the respective embodiments above, generating the second sequence in the present embodiment of the disclosure includes the following implementations.

In a first implementation:

the generating the second check sequence according to the attribute information of the information sequence in the second sequence generation algorithm corresponding to the transmitter includes the following step:

generating the second check sequence according to the information in the information sequence in a Cyclic Redundancy Check (CRC) algorithm corresponding to the transmitter; or generating the second check sequence according to the information in the information sequence in a hash function corresponding to the transmitter; or generating the second check sequence according to the length of the information sequence in a random function corresponding to the transmitter.

Particularly, if the transmitter generates the second sequence according to the information in the information sequence to be encoded, in a preset CRC algorithm, then the receiver will generate the second check sequence according to the information in the information sequence in the CRC algorithm corresponding to the transmitter; or If the transmitter generates the second sequence according to the information in the information sequence to be encoded, in a preset hash function, then the receiver will generate the second check sequence according to the information in the information sequence in the hash function corresponding to the transmitter.

If the transmitter generates the second sequence according to the length of the information sequence to be encoded, in a preset random function, then the receiver will generate the second check sequence according to the length of the information sequence in the random function corresponding to the transmitter.

In a second implementation:

the generating the second check sequence according to the attribute information of the information sequence in the second sequence generation algorithm corresponding to the transmitter includes the following step:

generating the second check sequence according to the attribute information of the information sequence, and the first sequence in the second sequence generation algorithm corresponding to the transmitter.

Particularly, if the transmitter generates the second sequence according to the attribute information of the information sequence to be encoded, and the first sequence in a preset second sequence generation algorithm, then the receiver will generate the second check sequence according to the attribute information of the information sequence, and the first sequence in the second sequence generation algorithm corresponding to the transmitter.

For example, if the second sequence generation algorithm of the transmitter is a CRC algorithm, and the transmitter combines the information sequence with the first sequence, where the information sequence precedes to the first sequence, and generates the second sequence according to a resulting sequence in the CRC algorithm, then the receiver will also combine the information sequence with the first sequence, where the information sequence precedes to the first sequence, and generate the second check sequence according to a resulting sequence in the CRC algorithm corresponding to the transmitter; and if the second sequence generation algorithm of the transmitter is a hash function, and the transmitter combines the information sequence with the first sequence, where the information sequence precedes to the first sequence, and generates the second sequence according to a resulting sequence in the hash function, then the receiver will also combine the information sequence with the first sequence, where the information sequence precedes to the first sequence, and generate the second check sequence according to a resulting sequence in the hash function corresponding to the transmitter.

Fourteenth Embodiment

In order to transmit a code word accurately, further to the respective embodiments above, the generating the second check sequence according to the information in the information sequence in the CRC algorithm corresponding to the transmitter in the present embodiment of the disclosure includes the following step:

generating a sub-sequence according to the information in the information sequence in the CRC algorithm corresponding to the transmitter, and generating the second check sequence according to the information in the information sequence, and the sub-sequence in the CRC algorithm; or generating a sub-sequence according to the information in the information sequence in a hash function corresponding to the transmitter, and generating the second check sequence according to the information in the information sequence, and the sub-sequence in the CRC algorithm corresponding to the transmitter; or generating a sub-sequence according to the length of the information sequence in a random function corresponding to the transmitter, and generating the second check sequence according to the information in the information sequence, and the sub-sequence in the CRC algorithm corresponding to the transmitter.

Particularly, if the transmitter generates a sub-sequence according to the information in the information sequence to be encoded, in a preset CRC algorithm, and generates the second sequence according to the information in the information sequence to be encoded, and the sub-sequence in the CRC algorithm, then the receiver will generate a sub-sequence according to the information in the information sequence in the CRC algorithm corresponding to the transmitter, and generate the second check sequence according to the information in the information sequence, and the sub-sequence in the CRC algorithm corresponding to the transmitter.

If the transmitter generates a sub-sequence according to the information in the information sequence to be encoded, in a preset hash function, and generates the second sequence according to the information in the information sequence to be encoded, and the sub-sequence in the CRC algorithm, then the receiver will generate a sub-sequence according to the information in the information sequence in the hash function corresponding to the transmitter, and generate the second check sequence according to the information in the information sequence, and the sub-sequence in the CRC algorithm corresponding to the transmitter.

If the transmitter generates a sub-sequence according to the length of the information sequence to be encoded, in a preset random function, and generates the second sequence according to the information in the information sequence to be encoded, and the sub-sequence in the CRC algorithm, then the receiver will generate a sub-sequence according to the length of the information sequence in the random function corresponding to the transmitter, and generate the second check sequence according to the information in the information sequence, and the sub-sequence in the CRC algorithm corresponding to the transmitter.

Fifth Embodiment

Further to the respective embodiments above, the generating the second check sequence according to the information in the information sequence in the hash function corresponding to the transmitter in the present embodiment of the disclosure includes the following step:

generating a sub-sequence according to the information in the information sequence in a CRC algorithm corresponding to the transmitter, and generating the second check sequence according to the information in the information sequence, and the sub-sequence in the hash function corresponding to the transmitter; or generating a sub-sequence according to the information in the information sequence in the hash function corresponding to the transmitter, and generating the second check sequence according to the information in the information sequence, and the sub-sequence in the hash function corresponding to the transmitter; or generating a sub-sequence according to the information in the information sequence in a random function corresponding to the transmitter, and generating the second check sequence according to the information in the information sequence, and the sub-sequence in the hash function corresponding to the transmitter.

Particularly, if the transmitter generates a sub-sequence according to the information in the information sequence to be encoded, in a preset CRC algorithm, and generates the second sequence according to the information in the information sequence to be encoded, and the sub-sequence in a preset hash function, then the receiver will generate a sub-sequence according to the information in the information sequence in the CRC algorithm corresponding to the transmitter, and generate the second check sequence according to the information in the information sequence, and the sub-sequence in the hash function corresponding to the transmitter.

If the transmitter generates a sub-sequence according to the information in the information sequence to be encoded, in a preset hash function, and generates the second sequence according to the information in the information sequence to be encoded, and the sub-sequence in the preset hash function, then the receiver will generate a sub-sequence according to the information in the information sequence in the hash function corresponding to the transmitter, and generate the second check sequence according to the information in the information sequence, and the sub-sequence in the hash function corresponding to the transmitter.

If the transmitter generates a sub-sequence according to the length of the information sequence to be encoded, in a preset random function, and generates the second sequence according to the information in the information sequence to be encoded, and the sub-sequence in a preset hash function, then the receiver will generate a sub-sequence according to the length of the information sequence in the random function corresponding to the transmitter, and generate the second check sequence according to the information in the information sequence, and the sub-sequence in the hash function corresponding to the transmitter.

Sixteenth Embodiment

Further to the respective embodiments above, the determining the decoding result according to the first check sequence and the second check sequence, and the corresponding first sequence and second sequence among the candidate sequences in the present embodiment of the disclosure includes the following step:

for candidate sequences over each candidate path, determining whether the first check sequence and the second check sequence are the same as corresponding first and second sequences among the candidate sequences, and if so, then determining the decoding result as an information sequence over the candidate sequence.

Particularly, for candidate sequences over each candidate path, it is determined whether a first sequence over the candidate sequence is the same as the first check sequence, and if so, then the path will be determined as a target path; and for each target path, it is determined whether a second sequence over the target path is the same as the second check sequence, and if so, then the target path will be determined as a decoding path, and the decoding result will be determined as an information sequence corresponding to the decoding path.

If neither the first sequence nor the second sequence among the candidate sequences over each candidate path is the same as the corresponding first check sequence or second check sequence, then the method will further include the following step:

determining the most reliable candidate path among the candidate paths as a decoding path, and determining an information sequence corresponding to the decoding path as the decoding result.

If neither the first sequence nor the second sequence over each candidate path is the same as the corresponding first check sequence or second check sequence, then the most reliable candidate path will be determined as a decoding path, and an information sequence corresponding to the decoding path will be determined as the decoding result. In the embodiment of the disclosure, the most reliable candidate path can be selected as a decoding path as in the prior art, so a repeated description thereof will be omitted here.

Figure 4:
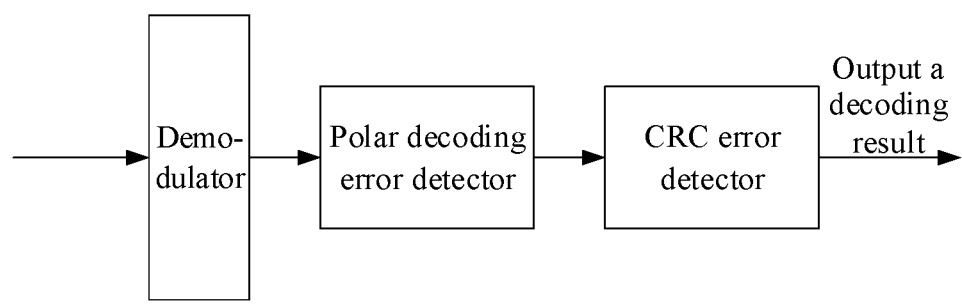
FIG. 4 is a schematic flow chart of a decoding process using polar codes according to a sixteenth embodiment of the disclosure.

FIG. 4 is a schematic flow chart of a decoding process using polar codes according to an embodiment of the disclosure, where after a sequence encoded using polar codes is modulated by a modulator, the sequence is transmitted, and a receiver, i.e., a decoder, firstly demodulates a received code word using a demodulator upon reception of the code word, determines the sequence encoded using polar codes, corresponding to the received code word, and feeds the sequence to a polar decoding error detector for decoding in an SCL decoding algorithm; the polar decoding error detector compares a first sequence over a candidate path after decoding with a first check sequence, and if they are identical, then the polar decoding error detector will input an information sequence and a second sequence over the candidate path to a CRC error detector for processing; and the CRC error detector performs CRC processing on the input information sequence to generate a second check sequence, and if a second sequence over the candidate path is the same as the second check sequence, then the CRC error detector will output the information sequence corresponding to the candidate path as a decoding result, so that an error detection can be performed using the first sequence and the second sequence jointly.

Seventh Embodiment

In order to guarantee the accuracy of decoding, before Successive Cancellation list (SCL) decoding is performed on the received sequence encoded using polar codes, the method further includes the following step:

rate-de-matching the received sequence encoded using polar codes in a pre-stored rate-matching algorithm.

Particularly, the same rate-matching algorithm as a transmitter is stored in advance the receiver, and a rate matched sequence for rate-de-matching by the receiver can be determined in a Gaussian scheme corresponding to the transmitter, or can be another rate matched sequence insensitive to a Signal Noise Ratio (SNR), where rate matching involves a repetition rule and a puncturing rule. For the received polar-encoded sequence, the pre-stored rate-matching algorithm is applied, and if the polar-encoded sequence has been repeated, then repeated bits in the polar-encoded sequence will be removed under the preset repetition rule; and if the polar-encoded sequence has been punctured, then removed bits in the polar-encoded sequence will be supplemented under the preset puncturing rule. In the embodiment of the disclosure, the sequence encoded using polar codes can be rate-de-matched in the pre-stored rate-matching algorithm as in the prior art, so a repeated description thereof will be omitted here.

Eighteenth Embodiment

Figure 5:
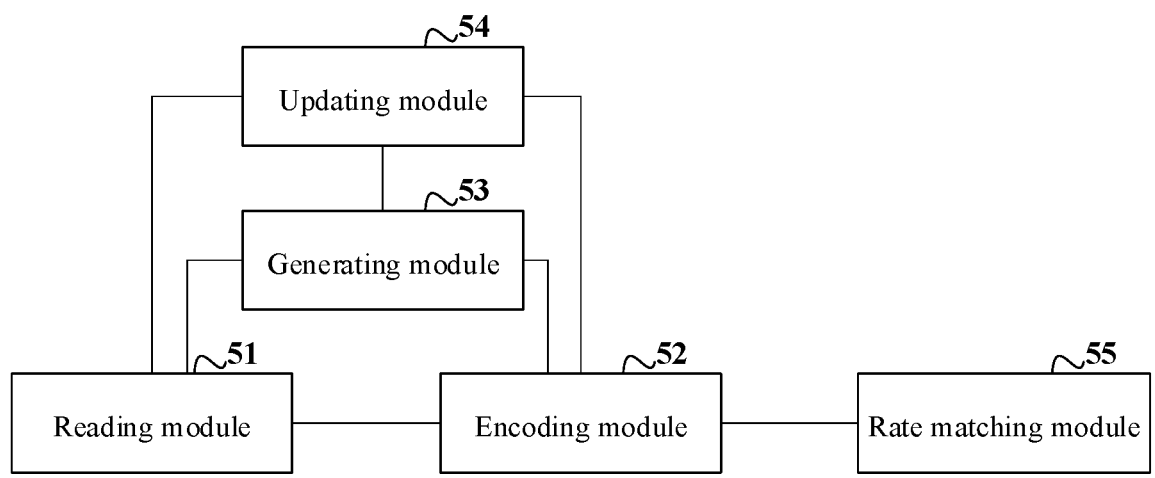
FIG. 5 is a schematic structural diagram of a polar code encoding device according to an eighteenth embodiment of the disclosure.

FIG. 5 is a schematic structural diagram of a polar code encoding device according to an embodiment of the disclosure, where the device includes:

a reading module 51 is configured to read a known first sequence; and an encoding module 52 is configured to combine an information sequence to be encoded, with the known first sequence, and to perform a polar code encoding on combined sequence.

The device further includes:

a generating module 53 is configured to generate a second sequence according to attribute information of the information sequence to be encoded, in a preset second sequence generation algorithm; and the encoding module 52 is further configured to combine the information sequence with the known first sequence and the second sequence, and to perform a polar code encoding on combined sequence.

The device further includes:

an updating module 54 is configured to update the known first sequence in a preset algorithm; and/or to update the second sequence in the preset algorithm, where the preset algorithm includes at least one of an EXOR algorithm, an interleaving algorithm, and an algorithm of updating a preset bit.

The generating module 53 is configured to generate the second sequence according to information in the information sequence to be encoded, in a preset Cyclic Redundancy Check (CRC) algorithm; or to generate the second sequence according to information in the information sequence to be encoded, in a preset hash function; or to generate the second sequence according to the length of the information sequence to be encoded, in a preset random function.

The generating module 53 is configured to generate a sub-sequence according to the information in the information sequence to be encoded, in the preset CRC algorithm, and to generate the second sequence according to the information in the information sequence to be encoded, and the sub-sequence in the CRC algorithm; or to generate a sub-sequence according to the information in the information sequence to be encoded, in a preset hash function, and to generate the second sequence according to the information in the information sequence to be encoded, and the sub-sequence in the CRC algorithm; or to generate a sub-sequence according to the length of the information sequence to be encoded, in a preset random function, and to generate the second sequence according to the information in the information sequence to be encoded, and the sub-sequence in the CRC algorithm.

The generating module 53 is configured to generate a sub-sequence according to the information in the information sequence to be encoded, in a preset CRC algorithm, and to generate the second sequence according to the information in the information sequence to be encoded, and the sub-sequence in the preset hash function; or to generate a sub-sequence according to the information in the information sequence to be encoded, in a preset hash function, and to generate the second sequence according to the information in the information sequence to be encoded, and the sub-sequence in the preset hash function; or to generate a sub-sequence according to the length of the information sequence to be encoded, in a preset random function, and to generate the second sequence according to the information in the information sequence to be encoded, and the sub-sequence in the preset hash function.

The generating module 53 is configured to generate the second sequence according to the attribute information of the information sequence to be encoded, and the first sequence in the preset second sequence generation algorithm.

The updating module 54 is configured to update the sequence and/or the second sequence using a scrambling sequence.

The device further includes:

a rate matching module 55 is configured to rate-match the sequence encoded using polar codes in a pre-stored rate matching algorithm.

Nineteenth Embodiment

Figure 6:
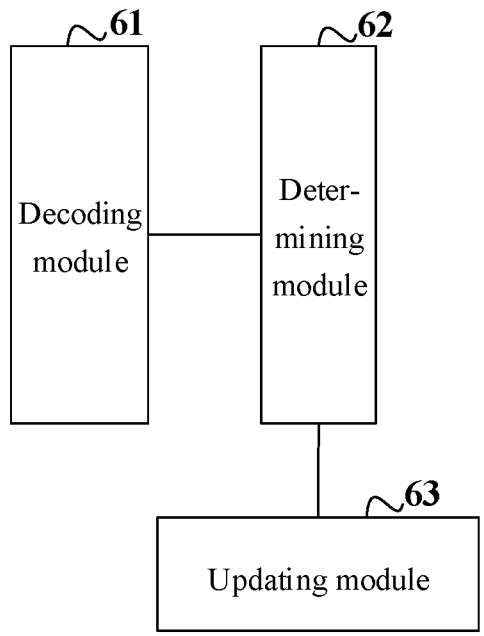
FIG. 6 is a schematic structural diagram of a polar code decoding device according to a nineteenth embodiment of the disclosure.

FIG. 6 is a schematic structural diagram of a polar code decoding device according to an embodiment of the disclosure, where the device includes:

a decoding module 61 is configured to perform Successive Cancellation List (SCL) decoding on a received sequence encoded using polar codes; and a determining module 62 is configured to determine an information sequence and a first sequence among candidate sequences in a plurality of candidate paths reserved as a result of decoding, to read a known first check sequence in the same way as a transmitter, and to determine a decoding result according to the first sequence and the first check sequence.

The determining module 62 is further configured: to determine a second sequence among the candidate sequences; to generate a second check sequence according to attribute information of the information sequence in a second sequence generation algorithm corresponding to the transmitter; and to determine the decoding result according to the first check sequence and the second check sequence, and the corresponding first sequence and second sequence among the candidate sequences.

The device further includes:

an updating module 63 is configured to update the first check sequence in an algorithm corresponding to the transmitter; and/or to update the second check sequence in the algorithm corresponding to the transmitter, where the algorithm corresponding to the transmitter includes at least one of an EXOR algorithm, an interleaving algorithm, and an algorithm of updating a preset bit.

The determining module 62 is configured to generate the second check sequence according to information in the information sequence in a Cyclic Redundancy Check (CRC) algorithm corresponding to the transmitter; or to generate the second check sequence according to information in the information sequence in a hash function corresponding to the transmitter; or to generate the second check sequence according to the length of the information sequence in a random function corresponding to the transmitter.

The determining module 62 is configured to generate a sub-sequence according to the information in the information sequence in the CRC algorithm corresponding to the transmitter, and to generate the second check sequence according to the information in the information sequence, and the sub-sequence in the CRC algorithm; or to generate a sub-sequence according to the information in the information sequence in a hash function corresponding to the transmitter, and to generate the second check sequence according to the information in the information sequence, and the sub-sequence in the CRC algorithm corresponding to the transmitter; or to generate a sub-sequence according to the length of the information sequence in a random function corresponding to the transmitter, and to generate the second check sequence according to the information in the information sequence, and the sub-sequence in the CRC algorithm corresponding to the transmitter.

The determining module 62 is configured to generate a sub-sequence according to the information in the information sequence in a CRC algorithm corresponding to the transmitter, and to generate the second check sequence according to the information in the information sequence, and the sub-sequence in the hash function corresponding to the transmitter; or to generate a sub-sequence according to the information in the information sequence in the hash function corresponding to the transmitter, and to generate the second check sequence according to the information in the information sequence, and the sub-sequence in the hash function corresponding to the transmitter; or to generate a sub-sequence according to the information in the information sequence in a random function corresponding to the transmitter, and to generate the second check sequence according to the information in the information sequence, and the sub-sequence in the hash function corresponding to the transmitter.

The determining module 62 is configured to generate the second check sequence according to the attribute information of the information sequence, and the first sequence in the second sequence generation algorithm corresponding to the transmitter.

The updating module 63 is configured to update the first check sequence and/or the second check sequence using a scrambling sequence corresponding to the transmitter.

The determining module 62 is configured, for candidate sequences over each candidate path, to determine whether the first check sequence and the second check sequence are the same as corresponding first and second sequences among the candidate sequences, and if so, to determine the decoding result as an information sequence over the candidate sequence.

Figure 7:
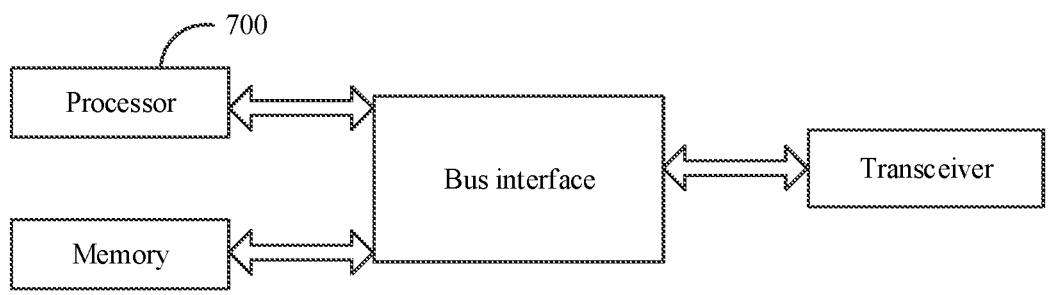
FIG. 7 is a schematic physically structural diagram of the polar code encoding device according to the eighteenth embodiment of the disclosure.

Based upon the same inventive idea, as illustrated in FIG. 7, an embodiment of the disclosure provides a polar code decoding device, which includes at least a processor 700, where:

the processor 700 is configured to read and execute program in a memory:

to read a known first sequence; and to combine an information sequence to be encoded, with the known first sequence, and to perform a polar code encoding on combined sequence.

Here in FIG. 7, the bus architecture can include any number of interconnecting buses and bridges to particularly link together various circuits including one or more processors represented by the processor 700, and one or more memories represented by the memory. The bus architecture can further link together various other circuits, e.g., a peripheral device, a manostat, a power management circuit, etc., all of which are well known in the art, so a further description thereof will be omitted in this context. The bus interface serves as an interface. A transceiver can be a number of elements, e.g., a transmitter and a receiver, which are units for communication with various other devices over a transmission medium. The processor 700 is responsible for managing the bus architecture and performing normal processes, and the memory can store data for use by the processor 700 in performing the operations.

Optionally, the processor 700 is further configured:

to generate a second sequence according to attribute information of the information sequence to be encoded, in a preset second sequence generation algorithm; and to combine the information sequence with the known first sequence and the second sequence, and to perform a polar code encoding on combined sequence.

Optionally, the processor 700 is further configured:

to update the known first sequence in a preset algorithm; and/or to update the second sequence in the preset algorithm, where the preset algorithm includes at least one of an EXOR algorithm, an interleaving algorithm, and an algorithm of updating a preset bit.

Optionally, the processor 700 is configured:

to generate the second sequence according to information in the information sequence to be encoded, in a preset Cyclic Redundancy Check (CRC) algorithm; or to generate the second sequence according to information in the information sequence to be encoded, in a preset hash function; or to generate the second sequence according to the length of the information sequence to be encoded, in a preset random function.

Optionally, the processor 700 is configured:

to generate a sub-sequence according to the information in the information sequence to be encoded, in the preset CRC algorithm, and to generate the second sequence according to the information in the information sequence to be encoded, and the sub-sequence in the CRC algorithm; or to generate a sub-sequence according to the information in the information sequence to be encoded, in a preset hash function, and to generate the second sequence according to the information in the information sequence to be encoded, and the sub-sequence in the CRC algorithm; or to generate a sub-sequence according to the length of the information sequence to be encoded, in a preset random function, and to generate the second sequence according to the information in the information sequence to be encoded, and the sub-sequence in the CRC algorithm.

Optionally, the processor 700 is configured:

to generate a sub-sequence according to the information in the information sequence to be encoded, in a preset CRC algorithm, and to generate the second sequence according to the information in the information sequence to be encoded, and the sub-sequence in the preset hash function; or to generate a sub-sequence according to the information in the information sequence to be encoded, in the preset hash function, and to generate the second sequence according to the information in the information sequence to be encoded, and the sub-sequence in the preset hash function; or to generate a sub-sequence according to the length of the information sequence to be encoded, in a preset random function, and to generate the second sequence according to the information in the information sequence to be encoded, and the sub-sequence in the preset hash function.

Optionally, the processor 700 is configured:

to generate the second sequence according to the attribute information of the information sequence to be encoded, and the first sequence in the preset second sequence generation algorithm.

Optionally, the processor 700 is configured:

To update the sequence and/or the second sequence using a scrambling sequence.

Optionally the processor 700 is configured:

to rate-match the sequence encoded using polar codes in a pre-stored rate matching algorithm.

Figure 8:
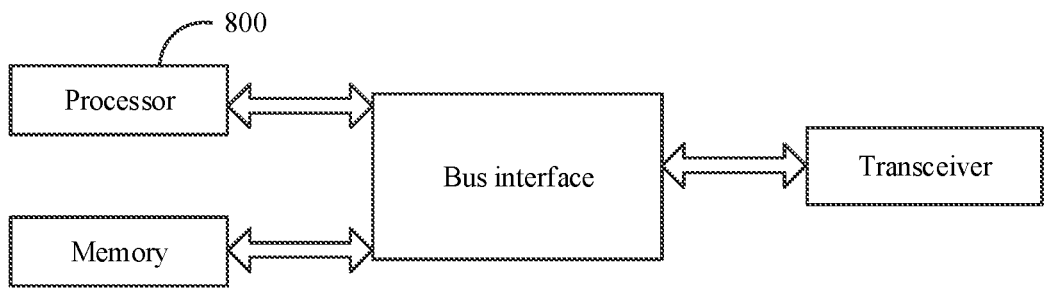
FIG. 8 is a schematic physically structural diagram of the polar code decoding device according to the nineteenth embodiment of the disclosure.

Based upon the same inventive idea, as illustrated in FIG. 8, an embodiment of the disclosure provides a polar code decoding device, which includes at least a processor 800, where:

the processor 800 is configured to read and execute program in a memory:

to perform Successive Cancellation List (SCL) decoding on a received sequence encoded using polar codes; and to determine an information sequence and a first sequence among candidate sequences in a plurality of candidate paths reserved as a result of decoding, to read a known first check sequence in the same way as a transmitter, and to determine a decoding result according to the first sequence and the first check sequence.

Here in FIG. 8, the bus architecture can include any number of interconnecting buses and bridges to particularly link together various circuits including one or more processors represented by the processor 800, and one or more memories represented by the memory. The bus architecture can further link together various other circuits, e.g., a peripheral device, a manostat, a power management circuit, etc., all of which are well known in the art, so a further description thereof will be omitted in this context. The bus interface serves as an interface. A transceiver can be a number of elements, e.g., a transmitter and a receiver, which are units for communication with various other devices over a transmission medium. The processor 800 is responsible for managing the bus architecture and performing normal processes, and the memory can store data for use by the processor 800 in performing the operations.

Optionally, the processor 800 is further configured:

to determine a second sequence among the candidate sequences; to generate a second check sequence according to attribute information of the information sequence in a second sequence generation algorithm corresponding to the transmitter; and to determine the decoding result according to the first check sequence and the second check sequence, and the corresponding first sequence and second sequence among the candidate sequences.

Optionally, the processor 800 is further configured:

to update the first check sequence in an algorithm corresponding to the transmitter; and/or to update the second check sequence in the algorithm corresponding to the transmitter, where the algorithm corresponding to the transmitter includes at least one of an EXOR algorithm, an interleaving algorithm, and an algorithm of updating a preset bit.

Optionally, the processor 800 is further configured:

to generate the second check sequence according to information in the information sequence in a Cyclic Redundancy Check (CRC) algorithm corresponding to the transmitter; or to generate the second check sequence according to information in the information sequence in a hash function corresponding to the transmitter; or to generate the second check sequence according to the length of the information sequence in a random function corresponding to the transmitter.

Optionally, the processor 800 is further configured:

to generate a sub-sequence according to the information in the information sequence in the CRC algorithm corresponding to the transmitter, and to generate the second check sequence according to the information in the information sequence, and the sub-sequence in the CRC algorithm; or to generate a sub-sequence according to the information in the information sequence in a hash function corresponding to the transmitter, and to generate the second check sequence according to the information in the information sequence, and the sub-sequence in the CRC algorithm corresponding to the transmitter; or to generate a sub-sequence according to the length of the information sequence in a random function corresponding to the transmitter, and to generate the second check sequence according to the information in the information sequence, and the sub-sequence in the CRC algorithm corresponding to the transmitter.

Optionally, the processor 800 is further configured:

to generate a sub-sequence according to the information in the information sequence in a CRC algorithm corresponding to the transmitter, and to generate the second check sequence according to the information in the information sequence, and the sub-sequence in the hash function corresponding to the transmitter; or to generate a sub-sequence according to the information in the information sequence in the hash function corresponding to the transmitter, and to generate the second check sequence according to the information in the information sequence, and the sub-sequence in the hash function corresponding to the transmitter; or to generate a sub-sequence according to the information in the information sequence in a random function corresponding to the transmitter, and to generate the second check sequence according to the information in the information sequence, and the sub-sequence in the hash function corresponding to the transmitter.

Optionally, the processor 800 is further configured:

to generate the second check sequence according to the attribute information of the information sequence, and the first sequence in the second sequence generation algorithm corresponding to the transmitter.

Optionally, the processor 800 is further configured:

to update the first check sequence and/or the second check sequence using a scrambling sequence corresponding to the transmitter.

Optionally, the processor 800 is further configured:

for candidate sequences over each candidate path, to determine whether the first check sequence and the second check sequence are the same as corresponding first and second sequences among the candidate sequences, and if so, to determine the decoding result as an information sequence over the candidate sequence.

The embodiments of the disclosure provide an encoding method and device using polar codes, and a decoding method and device using polar codes, and the encoding method using polar codes includes: reading a known first sequence; and combining an information sequence to be encoded, with the known first sequence, and performing a polar code encoding on combined sequence. In the encoding method and device using polar codes according to the embodiment of the disclosure, a known first sequence is read, and then an information sequence and the first sequence are encoded using polar codes, so that the information sequence to be encoded are encoded using polar codes, and there is provided a new solution to encoding using polar codes.

Those skilled in the art shall appreciate that the embodiments of the disclosure can be embodied as a method, a system or a computer program product. Therefore the disclosure can be embodied in the form of an all-hardware embodiment, an all-software embodiment or an embodiment of software and hardware in combination. Furthermore the disclosure can be embodied in the form of a computer program product embodied in one or more computer useable storage mediums (including but not limited to a disk memory, a CD-ROM, an optical memory, etc.) in which computer useable program codes are contained.

The disclosure has been described in a flow chart and/or a block diagram of the method, the device (system) and the computer program product according to the embodiments of the disclosure. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the embodiments of the disclosure have been described, those skilled in the art benefiting from the underlying inventive concept can make additional modifications and variations to these embodiments. Therefore the appended claims are intended to be construed as encompassing the embodiments and all the modifications and variations coming into the scope of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An encoding method using polar codes, the method comprising:

reading a known first sequence; and combining an information sequence to be encoded, with the known first sequence, and performing a polar code encoding on combined sequence;

wherein before the combining the information sequence with the known first sequence, and performing the polar code encoding on the combined sequence, the method further comprises:

generating a second sequence according to attribute information of the information sequence to be encoded, in a preset second sequence generation algorithm; and the combining the information sequence with the known first sequence, and performing the polar code encoding on the combined sequence comprises:

combining the information sequence with the known first sequence and the second sequence, and performing a polar code encoding on combined sequence;

wherein before the combining the information sequence with the known first sequence and the second sequence, and encoding the resulting sequence using polar codes, the method comprises at least one of followings:

updating the known first sequence in a preset algorithm; and updating the second sequence in the preset algorithm, wherein the preset algorithm comprises at least one of an EXOR algorithm, an interleaving algorithm, or an algorithm of updating a preset bit.

2. The method according to claim 1, wherein the attribute information of the information sequence to be encoded comprises at least one of:

a length of the information sequence to be encoded and information in the information sequence to be encoded;

wherein the generating the second sequence according to the attribute information of the information sequence to be encoded, in the preset second sequence generation algorithm comprises:

generating the second sequence according to the information in the information sequence to be encoded, in a preset Cyclic Redundancy Check (CRC) algorithm; or generating the second sequence according to the information in the information sequence to be encoded, in a preset hash function; or generating the second sequence according to the length of the information sequence to be encoded, in a preset random function.

3. The method according to claim 1, wherein the generating the second sequence according to the attribute information of the information sequence to be encoded, in the preset second sequence generation algorithm comprises:

generating the second sequence according to the attribute information of the information sequence to be encoded, and the known first sequence in the preset second sequence generation algorithm.

4. The method according to claim 1, further comprises:

rate-matching polar-code encoded sequence in a pre-stored rate matching algorithm.

5. A decoding method using polar codes, the method comprising:

performing Successive Cancellation List (SCL) decoding on a received sequence encoded using polar codes; and determining an information sequence and a first sequence among candidate sequences in a plurality of candidate paths reserved as a result of decoding, reading a first check sequence in a same way as a transmitter, and determining a decoding result according to the first sequence and the first check sequence.

6. The method according to claim 5, wherein before the determining the decoding result according to the first sequence and the first check sequence, the method further comprises:

determining a second sequence among the candidate sequences; and the determining the decoding result according to the first sequence and the first check sequence comprises:

generating a second check sequence according to attribute information of the information sequence in a second sequence generation algorithm corresponding to the transmitter; and determining the decoding result according to the first check sequence and the second check sequence, and the corresponding first sequence and second sequence among the candidate sequences.

7. The method according to claim 6, wherein before the determining the decoding result according to the first check sequence and the second check sequence, and the corresponding first sequence and second sequence among the candidate sequences, the method further comprises:

updating the first check sequence in an algorithm corresponding to the transmitter; and/or updating the second check sequence in the algorithm corresponding to the transmitter, wherein the algorithm corresponding to the transmitter comprises at least one of an EXOR algorithm, an interleaving algorithm, or an algorithm of updating a preset bit.

8. The method according to claim 6, wherein the attribute information of the information sequence comprises at least one of:

a length of the information sequence to be encoded and information in the information sequence to be encoded;

wherein the generating the second check sequence according to the attribute information of the information sequence in the second sequence generation algorithm corresponding to the transmitter comprises:

generating the second check sequence according to the information in the information sequence in a Cyclic Redundancy Check (CRC) algorithm corresponding to the transmitter; or generating the second check sequence according to the information in the information sequence in a hash function corresponding to the transmitter; or generating the second check sequence according to the length of the information sequence in a random function corresponding to the transmitter.

9. The method according to claim 6, wherein the generating the second check sequence according to the attribute information of the information sequence in the second sequence generation algorithm corresponding to the transmitter comprises:

generating the second check sequence according to the attribute information of the information sequence, and the first sequence in the second sequence generation algorithm corresponding to the transmitter.

10. The method according to claim 6, wherein the determining the decoding result according to the first check sequence and the second check sequence, and the corresponding first sequence and second sequence among the candidate sequences comprises:

for candidate sequences in each candidate path, determining whether the first check sequence and the second check sequence are respectively same as corresponding first and second sequences among the candidate sequences, and if so, determining the decoding result as an information sequence in the candidate path.

11. A polar code encoding device, the device comprising a memory configured to store a computer readable program and at least one processor configured to execute the computer readable program to:

read a known first sequence; and combine an information sequence to be encoded, with the known first sequence, and to perform a polar code encoding on combined sequence;

wherein the at least one processor is further configured to execute the computer readable program to:

generate a second sequence according to attribute information of the information sequence to be encoded, in a preset second sequence generation algorithm; and combine the information sequence with the known first sequence and the second sequence, and to perform a polar code encoding on combined sequence;

wherein the at least one processor is further configured to execute the computer readable program to:

update the known first sequence in a preset algorithm; and/or to update the second sequence in the preset algorithm, wherein the preset algorithm comprises at least one of an EXOR algorithm, an interleaving algorithm, or an algorithm of updating a preset bit.

12. The device according to claim 11, wherein the at least one processor is configured to execute the computer readable program to generate the second sequence according to information in the information sequence to be encoded, in a preset Cyclic Redundancy Check (CRC) algorithm; or to generate the second sequence according to information in the information sequence to be encoded, in a preset hash function; or to generate the second sequence according to a length of the information sequence to be encoded, in a preset random function.

13. The device according to claim 11, wherein the generating module is configured to generate the second sequence according to the attribute information of the information sequence to be encoded, and the first sequence in the preset second sequence generation algorithm.

14. The device according to claim 11, wherein the at least one processor is configured to execute the computer readable program to:

rate-match a polar code encoded sequence in a pre-stored rate matching algorithm.

15. A polar code decoding device, the device comprising a memory configured to store a computer readable program and at least one processor configured to execute the computer readable program to:

perform Successive Cancellation List (SCL) decoding on a received sequence encoded using polar codes; and determine an information sequence and a first sequence among candidate sequences in a plurality of candidate paths reserved as a result of decoding, to read a first check sequence in a same way as a transmitter, and to determine a decoding result according to the first sequence and the first check sequence.

16. The device according to claim 15, wherein the at least one processor is configured to execute the computer readable program to: determine a second sequence among the candidate sequences; generate a second check sequence according to attribute information of the information sequence, and the first sequence in a second sequence generation algorithm corresponding to the transmitter; and determine the decoding result according to the first check sequence and the second check sequence, and the corresponding first sequence and second sequence among the candidate sequences.

17. The device according to claim 16, wherein the at least one processor is configured to execute the computer readable program to:

update the first check sequence in an algorithm corresponding to the transmitter; and/or update the second check sequence in the algorithm corresponding to the transmitter, wherein the algorithm corresponding to the transmitter comprises at least one of an EXOR algorithm, an interleaving algorithm, or an algorithm of updating a preset bit.

18. The device according to claim 16, wherein the at least one processor is configured to execute the computer readable program to generate the second check sequence according to information in the information sequence in a Cyclic Redundancy Check (CRC) algorithm corresponding to the transmitter; or to generate the second check sequence according to information in the information sequence in a hash function corresponding to the transmitter; or to generate the second check sequence according to the length of the information sequence in a random function corresponding to the transmitter.

19. The device according to claim 16, wherein the determining module is configured to generate the second check sequence according to the attribute information of the information sequence, and the first sequence in the second sequence generation algorithm corresponding to the transmitter.

20. The device according to claim 16, wherein the at least one processor is configured to execute the computer readable program, for candidate sequences in each candidate path, to determine whether the first check sequence and the second check sequence are same as corresponding first and second sequences among the candidate sequences, and if so, to determine the decoding result as an information sequence in the candidate path.

* * * * *